United States Patent

Funada et al.

[11] Patent Number: 5,972,739
[45] Date of Patent: Oct. 26, 1999

[54] METHOD OF MANUFACTURING A TAB SEMICONDUCTOR DEVICE

[75] Inventors: Yoshitsugu Funada; Koji Matsui, both of Tokyo, Japan

[73] Assignee: NEC Corporation, Tokyo, Japan

[21] Appl. No.: 09/041,592

[22] Filed: Mar. 13, 1998

Related U.S. Application Data

[62] Division of application No. 08/636,967, Apr. 24, 1996, abandoned.

[30] Foreign Application Priority Data

Apr. 28, 1995 [JP] Japan .................................. 7-106122

[51] Int. Cl.⁶ ........................ H01L 21/44; H01L 21/48; H01L 21/50
[52] U.S. Cl. ............................... 438/127; 438/106
[58] Field of Search ...................... 438/127, 106

[56] References Cited

U.S. PATENT DOCUMENTS

| | | | |
|---|---|---|---|
| 4,326,238 | 4/1982 | Takeda et al. | 361/386 |
| 4,337,182 | 6/1982 | Needham | 524/609 |
| 4,903,119 | 2/1990 | Ito et al. | 357/72 |
| 4,970,575 | 11/1990 | Soga et al. | |
| 4,970,780 | 11/1990 | Suda et al. | 29/840 |
| 4,985,751 | 1/1991 | Shiobara et al. | 357/72 |
| 5,043,211 | 8/1991 | Yoshizumi et al. | |
| 5,298,548 | 3/1994 | Shiobara et al. | 523/443 |
| 5,597,422 | 1/1997 | Kataoka et al. | 136/259 |
| 5,756,380 | 5/1998 | Berg et al. | |

*Primary Examiner*—John F. Niebling
*Assistant Examiner*—Josetta Jones
*Attorney, Agent, or Firm*—Whitham, Curtis & Whitham

[57] ABSTRACT

A resin-encapsulated semiconductor device includes a semiconductor chip consisting of a semiconductor element having metal bumps and metal leads electrically connected to the metal bumps and having a surface-treated layer obtained by a surface treatment, and a resin film stacked on the outer side of the semiconductor chip and tightly adhered to the semiconductor chip by a heat treatment and pressurization treatment.

20 Claims, 2 Drawing Sheets

METHOD OF MANUFACTURING A TAB SEMICONDUCTOR DEVICE

This is a divisional of U.S. Ser. No. 08/636,967 filed Apr. 24, 1996, now abandoned.

BACKGROUND OF THE INVENTION

1. Field of the Invention

The present invention relates to a resin-encapsulated semiconductor device and a method of manufacturing the same and, more particularly, to a resin-encapsulated semiconductor device made by stacking a resin film to attain a low profile of a semiconductor package and a method of manufacturing the same.

2. Description of the Prior Art

Conventionally, a semiconductor device has its entire structure encapsulated or sealed with a resin mold, thereby preventing damages or ensuring sealing properties. In a conventional general resin-encapsulated semiconductor device, a semiconductor element is fixed to the die pad portion at the center of a lead frame. The electrode portion of the semiconductor element is adhered to the distal end portions of leads (i.e., inner leads) arranged around the die pad portion of the lead frame by using connector wire bonding, and the resultant structure is resin-molded. Normally, transfer molding using a mold is performed, and unnecessary portions of the lead frames are cut off, thereby manufacturing a semiconductor device.

However, a multi-pin package has a large wire length because of the limitation on the inner lead pitch. In the conventional technique, therefore, the wires are deformed by the resin flow in transfer molding of the resin, resulting in a short failure and a difficulty in attaining a low profile. In addition, the mold cost of transfer molding is high, and the effective resin utilization ratio is very low. For this reason, this method is not preferable from the viewpoint of decreasing the cost or saving the resources.

On the other hand, reductions in size and weight of electronic equipment have been strongly required in recent years. As packages suitable for thin devices represented by an IC card, COB or TAB are popularly used in which a bare chip is directly connected to a board and resin-encapsulated. These packages are generally manufactured by potting using a liquid resin.

In the prior art above, however, it is difficult to obtain a flat surface with a uniform thickness, resulting in a degradation in outer appearance. For this reason, a bore is formed at a predetermined portion of a board on which a semiconductor chip is to be mounted. A liquid resin is dropped in some excessive amount on the bore and cured in a heaped-up state. Subsequently, the extra cured resin portion is removed by polishing. However, this method poses problems of a decrease in productivity, a deterioration in reliability of the semiconductor chip due to a crack in the encapsulating resin, and the like.

A structure for mounting a chip on a board by the flip chip scheme has been proposed in Japanese Laid-Open Patent Publication No. 4-345041 in which a chip and a board are connected through an insulating film having a plurality of through holes and consisting of a resin with heat-fusion properties. However, to satisfactorily tightly adhered the chip to the board through the resin film, the resin must be actively flowed, and a positional shift tends to occur. Conversely, if the flow is insufficient, no satisfactory tight adhesion can be obtained.

SUMMARY OF THE INVENTION

The present invention has been made in consideration of the above situation, and has as its object to provide a semiconductor device advantageous for low profile, and a method of manufacturing the same, which enables effective utilization of a resin at a low cost and also prevents deterioration in outer appearance and reliability.

In order to achieve the above object, according to the basic aspect of the present invention, there is provided a resin-encapsulated semiconductor device comprising a semiconductor chip consisting of a semiconductor element having metal bumps and metal leads electrically connected to the metal bumps and having a surface-treated layer obtained by a surface treatment, and a resin film stacked on an outer side of the semiconductor chip and tightly adhered to the semiconductor chip by a heat treatment and pressurization treatment.

The surface-treated layer of the semiconductor device according to the basic aspect is a layer treated by a silane coupling agent.

The resin film of the semiconductor device according to the basic aspect is a B-stage sheet of a thermosetting resin.

The resin film of the semiconductor device according to the basic aspect contains at least one substance selected from the group consisting of particles, fibers, and nonwoven fabric.

The thermosetting resin of the semiconductor device according to the basic aspect is an epoxy resin, a BT resin, a diallyl phthalate resin, or a derivative thereof.

In order to achieve the above object, according to the first aspect of the present invention, there is provided a method of manufacturing a TAB semiconductor device comprising a semiconductor element portion, a film carrier portion, and an encapsulating resin, comprising the steps of performing a surface treatment of a surface of a semiconductor chip by using a 0.5%- to 5%-solution of a silane coupling agent, the semiconductor chip consisting of a semiconductor element having metal bumps and metal leads electrically connected to the metal bumps, stacking a resin film having an area larger than the chip on front and rear surfaces of the semiconductor chip which has been subjected to the surface treatment, temporarily contact-bonding the stacked resin film to the semiconductor chip by heating the resin film in an atmosphere at a temperature equal to or higher than a glass transition temperature of the resin film, and thermally setting the stacked resin film by further heating the resin film.

According to the second aspect of the present invention, there is provided a method of manufacturing a TAB semiconductor device, comprising the steps of temporarily contact-bonding a printed board having a board electrode portion at a semiconductor element mounting portion and a resin film having holes at portions where electrical connection is required by heating the resin film to a temperature equal to or higher than a glass transition temperature of the resin film, inserting metal bumps arranged on a semiconductor element which has been subjected to a surface treatment using a 0.5%- to 5%-solution of a silane coupling agent in the holes of the printed board while positioning the metal bumps in a face down state, and achieving electrical connection of the semiconductor element to the board electrode of the printed board by heating and reflowing the metal bumps.

According to the third aspect of the present invention, there is provided a method of manufacturing a TAB semiconductor device, comprising the steps of temporarily contact-bonding a printed board having a board electrode portion at a semiconductor chip mounting portion and a resin film having holes at portions where electrical connection is required by heating the resin film to a temperature equal to or higher than a glass transition temperature of the resin film, inserting metal bumps arranged on a semiconductor element which has been subjected to a surface treatment using a 0.5%- to 5%-solution of a silane coupling agent in the holes of the printed board while positioning the metal bumps in a face down state, achieving electrical connection of the semiconductor element to the board electrode of the printed board by heating and reflowing the metal bumps, stacking a resin film having an area larger than the element on a rear surface of the semiconductor element electrically connected to the printed board, temporarily contact-bonding the stacked resin film to the semiconductor chip by heating the resin film in an atmosphere at a temperature equal to or higher than the glass transition temperature of the resin film, and thermally setting the stacked resin film by further heating the resin film.

According to the fourth aspect of the present invention, there is provided a method of manufacturing a TAB semiconductor device, comprising the steps of temporarily contact-bonding a printed board having a board electrode portion at a semiconductor chip mounting portion and a resin film having holes at portions where electrical connection is required by heating the resin film to a temperature higher than a glass transition temperature of the resin film, inserting metal bumps arranged on a semiconductor element which has been subjected to surface treatment using a 0.5%- to 5%-solution of a silane coupling agent in the holes of the printed board while positioning the metal bumps in a face down state, achieving electrical connection to the board electrode of the printed board by heating and reflowing the metal bumps, adhering a resin film to a side surface of the semiconductor element electrically connected to the printed board, temporarily contact-bonding the stacked resin film to the semiconductor chip by heating the resin film in an atmosphere at a temperature equal to or higher than the glass transition temperature of the resin film, and thermally setting the stacked resin film by further heating the resin film.

The silane coupling agent in the manufacturing methods according to the first to fourth aspects is γ-glycidoxy-propyl-tri-methoxy-silane or γ-amino-propyl-tri-methoxy-silane.

The step of temporarily contact-bonding the stacked resin film to the semiconductor element in the manufacturing methods according to the first to fourth aspects is performed in a reduced atmosphere.

The step of thermally setting the stacked resin film in the manufacturing methods according to the first to fourth aspects is performed in a nitrogen atmosphere.

According to the present invention having the above aspects, a surface-treated layer is formed on the surfaces of a semiconductor element and leads electrically connected to the semiconductor element, and a resin film is stacked on the outer side of the surface-treated layer, thereby encapsulating the semiconductor element. With these simple manufacturing processes, effective utilization of the resin is enabled, unlike the conventional transfer molding which wastes the encapsulating resin. In addition, a low-profile semiconductor device can be manufactured at a low cost without impairing the outer appearance.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

Figure 1:
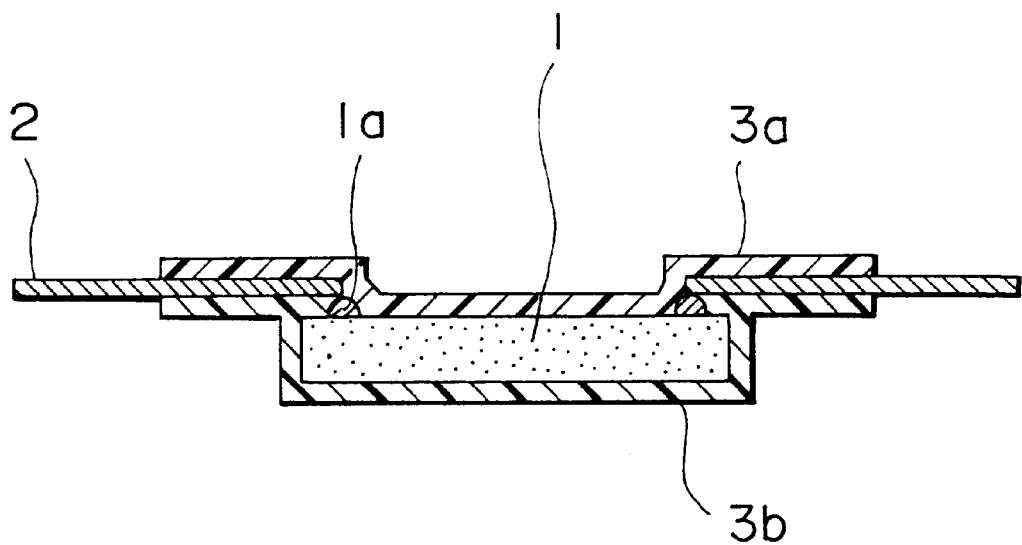
FIG. 1 is a sectional view showing an embodiment of the present invention.

The present invention will be described below in more detail.

A package structure to which the present invention is applied is of a bare chip type without using any curved connector wire and represented by a TAB package. For a TAB package, leads formed into a desired shape by etching a metal such as copper deposited on an insulating film of a polyimide or the like are bonded to bumps which are projecting portions consisting of a metal such as gold, silver, copper, or solder formed in advance on the electrode terminal of a semiconductor element by inner lead bonding using thermocompression or eutectic bonding. The bump normally has a height of about 10 to 200 μm and a diameter of about 10 to 500 μm.

When a resin film is to be stacked on this semiconductor element and the leads, the surface of the base is treated to obtain satisfactory adhesion. The surface treatment method is not particularly limited, and a physical treatment, chemical treatment, or the like can be performed. To obtain satisfactory adhesion between a metal, i.e., an inorganic material, and a resin film, i.e., an organic material, chemical bonds are preferably formed by coupling. Titanate-based, aluminate-based, and silane-based coupling agents are available, and particularly, a silane coupling agent is preferably used.

A silane coupling agent which is chemically bonded to the functional group of a film-like resin is preferably used. Since an epoxy resin is normally used as a semiconductor encapsulating resin, a coupling agent having a functional group (amino or epoxy group) which reacts with an epoxy group is effectively used. More specifically, γ-amino-propyl-tri-methoxy-silane, γ-glycidoxy-propyl-trimethoxy-silane, and the like are available.

As silane coupling agent treatment, it is preferable that the package structure be immersed in an aqueous or organic solvent solution of a silane coupling agent and dried, and thereafter, be heat-treated as needed. If the package structure is particularly susceptible to the adverse influence of moisture, a relatively highly volatile hydrophobic solvent, and more specifically, hexane, heptane, cyclohexane, or the like can be used. The solvent can be volatilized after the package structure is immersed in the solution, and thereafter a heat treatment can be performed.

The concentration of the silane coupling agent is preferably about 0.5% to 5%. If the concentration is lower than 0.5%, no sufficient treatment effect can be obtained. On the other hand, if the concentration is higher than 5%, the treatment effect does not improve above a certain point, and additionally, the adhesion is degraded due to agglomeration of the silane coupling agent itself. Furthermore, the cost undesirably increases.

As a resin film to be stacked, either a thermosetting or thermoplastic resin can be used as far as it has electrical insulating properties. A thermosetting resin film is more preferable because it has an advantage in heat resistance reliability. More specifically, in addition to the above-mentioned epoxy resin, a BT resin, diallyl phthalate, diallyl isophthalate, or a B-stage sheet of derivatives of these resins is preferably used.

The resin film preferably has a thickness of about 30 to 150 μm at the same level as that of bumps, and the thickness changes according to the height of bumps. If the thickness is smaller than 30 μm, the film tends to rupture at the end portion of the chip or a lead when the package structure is pressurized in a heated atmosphere in subsequent stacking processes to increase adhesion. On the other hand, if the thickness is larger than 150 μm, the film becomes rigid. Therefore, even when the resin is heated and softened in stacking processes, the resin has poor step coverage to the end portions of the chip or leads, resulting in insufficient adhesion between the end portions of the chip or leads and the resin.

The resin film can contain a component which is normally added in an encapsulating agent, such as a filler or a coloring agent, as needed. Particularly, for the purpose of importing a high mechanical strength or decreasing the coefficient of thermal expansion, the resin, film preferably contains a filler such as particles, fibers, or nonwoven fabric. Either inorganic or organic filler can be used. From the viewpoint of characteristics and cost, silica particles used as a general sealing agent are preferably used.

To stack the resin film on the assembly of the semiconductor element and the leads (to be simply referred to as a chip hereinafter), the assembly is set in an atmosphere at a temperature higher than the glass transition temperature of the resin film, and the resin film having an area larger than the semiconductor element is sequentially temporarily contact-bonded to the front and rear surfaces of the semiconductor element, thereby molding a package. To improve the adhesion at this time, the resin film portion around the semiconductor element is preferably pressurized. The temporary contact-bonding temperature is preferably 5° C. to 20° C. higher than the glass transition temperature of the resin film. If the temporary contact-bonding temperature is lower, softening of the resin film is insufficient, resulting in poor adhesion. On the other hand, if the temporary contact-bonding temperature is higher, the film tends to rupture at the end portions of the semiconductor element or leads at the time of pressurization. Temporary contact-bonding is preferably performed in a reduced atmosphere. In the normal pressure atmosphere, air cells tend to form between the resin film and the semiconductor element or lead surface. In addition, the surface is undesirably oxidized depending on the lead material.

The temporary contact-bonding time is preferably five minutes or more, although this time changes in accordance with the resin material. If the time is shorter than five minutes, the resin film is not completely cured.

After temporary contact-bonding, full curing is performed. Full curing is preferably performed within the temperature range of the glass transition temperature of the resin glass ±20° C. for several hours in a nitrogen atmosphere.

When the resin film is stacked on the semiconductor element and the leads, the adhesion can be improved by treating the surface of the base.

The embodiments of the present invention will be described below with reference to the accompanying drawings. Note that the present invention is not limited to these embodiments.

First Embodiment

FIG. 1 is a sectional view of a semiconductor device manufactured by a method according to an embodiment of the present invention.

A copper foil is bonded on a polyimide film having a sprocket hole for convey and positioning and a device hole serving as an opening portion for receiving a semiconductor element 1. A film carrier tape having leads formed into a desired shape by etching the copper foil and a pad for electrical screening is bonded to the semiconductor element having gold bumps formed in advance on the electrode terminal by inner lead bonding using eutectic bonding. At this time, bonding can be performed by pressing a heating tool from the film side after the bumps are positioned with respect to the leads. Subsequently, electrical screening or a bias test is performed, and thereafter, the leads are cut to desired lengths.

After the chip is immersed in a 1%-hexane solution of γ-glycidoxypropyltrimetoxysilane for one hour, the hexane is volatilized, and a heat treatment is performed at 110° C. for 30 minutes. In this manner, a silane coupling treatment is performed for the surface of the semiconductor chip.

Subsequently, the chip is set on a Teflon plate such that its surface where bumps 1a of the semiconductor element 1 are formed faces up. A 75-μm thick B-stage epoxy film (glass transition temperature: 170° C.) 3a containing 30 wt % molten silica having an average particle size of 12 μm and cut to be larger than the semiconductor element 1 is mounted on the upper surface of the semiconductor element 1. The sheet is heated to about 180° C. from the upper side to be softened, and held at this temperature for ten minutes, thereby performing temporary contact-bonding. A Teflon sheet having an opening portion larger than the semiconductor element 1 is set while arranging the semiconductor element 1 at the center. The Teflon sheet is pressurized from the upper side of the Teflon sheet, so that leads 2 around the semiconductor element 1 are tightly adhered to the epoxy film 3a.

The chip is set again with its rear surface facing up. A B-stage epoxy film 3b is mounted on the rear surface of the semiconductor element 1, and similarly softened and temporarily contact-bonded. Thereafter, full curing is performed in a pressurized atmosphere at 150° C. for three hours.

When the resultant semiconductor device was subjected to a 168-hour humidity resistance test at 125° C. and 2.3 atm and a temperature cycle (150° C. to −65° C., 200 cycles) reliability test, no separation was observed.

Second Embodiment

Figure 2A:
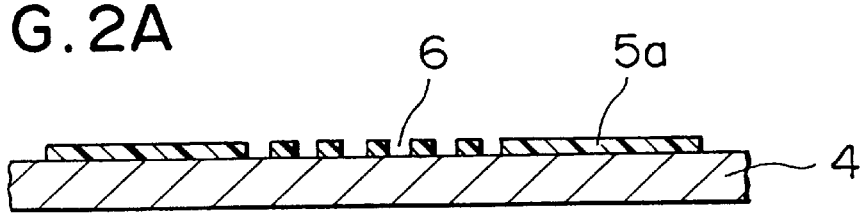
FIGS. 2A to 2C are sectional views showing steps of mounting a semiconductor chip on a printed board according to the present invention.
Figure 2B:
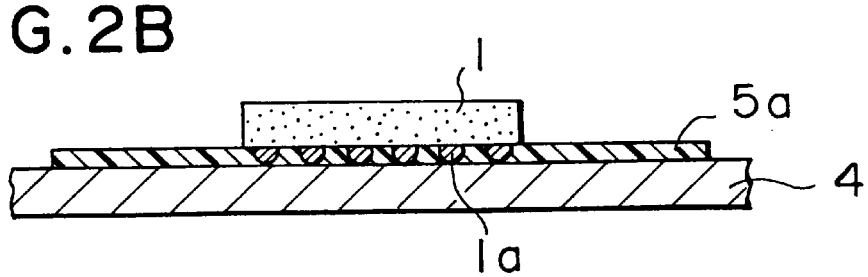
Figure 2C:
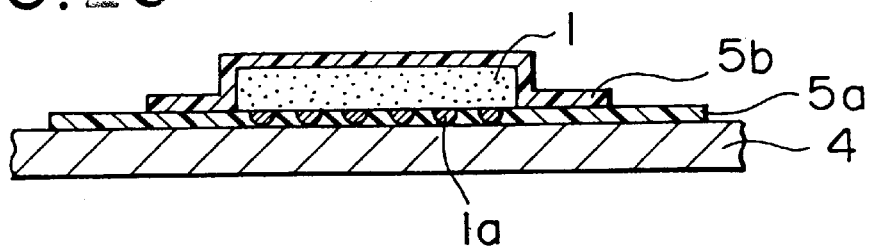

FIGS. 2A to 2C are sectional views showing steps in mounting a semiconductor chip on a board according to the present invention.

A 100-μm thick BT resin B-stage epoxy film (glass transition temperature: 190° C.) 5a is temporarily contact-bonded to the semiconductor chip mounting portion of a printed board 4 at 200° C. Using a laser beam, holes 6 are formed in the epoxy film 5a on the electrode portion of the printed board 4 electrically connected to bumps 1a arranged on a semiconductor element 1.

On the other hand, the semiconductor chip is immersed in a 1%-solution of γ-aminopropyltrimethoxysilane, so that a silane coupling treatment is performed for the chip surface, as in the first embodiment. Subsequently, the 100-μm high solder bumps 1a formed on the semiconductor element 1 are positioned and inserted to the holes 6 formed in the resin film 5a on the board electrode portion in a face down state. The solder is reflowed at 260° C. for ten seconds, thereby achieving electrical connection.

The printed board 4 is set in a nitrogen atmosphere at 200° C. A B-stage sheet 5b having an area larger than that of the semiconductor element 1 is mounted on the rear surface of the semiconductor element 1 to be softened and temporarily contact-bonded for ten minutes, as in the first embodiment. Full curing is performed while pressurizing the resin portion around the semiconductor element 1 in the nitrogen atmosphere at 200° C. for two hours.

The resultant printed board 4 was subjected to a reliability test under the same conditions as in the first embodiment. As a result, no separation was observed between the printed board 4 and the semiconductor element 1 or between the semiconductor element 1 and the film resin (5a or 5b).

Figure 3:
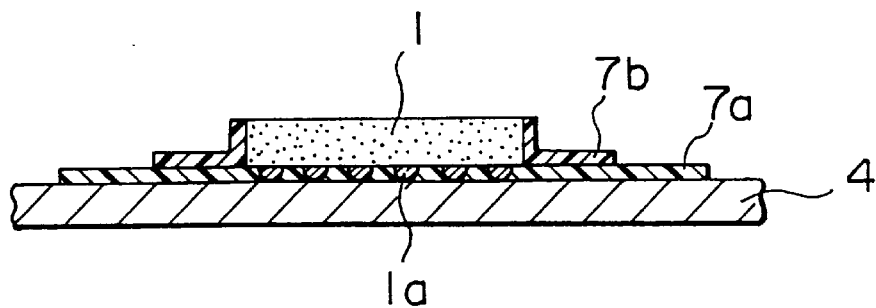
FIG. 3 is a sectional view showing another example of mounting a semiconductor chip on a printed board according to the present invention.

FIG. 3 is a sectional view showing another example of mounting a semiconductor chip on a board according to the present invention.

In the second embodiment, the resin sheet 5b is also stacked on the rear surface of the semiconductor element 1. However, the resin sheet need not always be stacked on this surface. As shown in FIG. 3, a film 7b can be adhered to only the side surface portion of the semiconductor element 1, or a liquid resin can be applied. Reference numeral 7a denotes a resin film tightly adhered on the printed board 4.

What we claim is:

1. A method of manufacturing a TAB semiconductor device comprising a semiconductor element portion, a film carrier portion, and an encapsulating resin, comprising the steps of:

performing a surface treatment of a surface of a semiconductor chip using a 0.5%- to 5%-solution of a silane coupling agent, said semiconductor chip comprising a semiconductor element having metal bumps thereon and metal leads electrically connected to said metal bumps, wherein said surface treatment comprises directly contacting at least one entire surface of said semiconductor element with said solution of said silane coupling agent;

stacking a resin film having an area larger than said chip on front and rear surfaces of said semiconductor chip which has been subjected to said surface treatment;

temporarily contact-bonding said stacked resin film to said semiconductor chip by heating said resin film in an atmosphere at a temperature not lower than a glass transition temperature of said resin film; and thermally setting said stacked resin film by further heating said resin film.

2. A method according to claim 1 wherein said silane coupling agent is a material selected from the group consisting of γ-glycidoxypropyltrimethoxysilane and γ-aminopropyltrimethoxysilane.

3. A method of manufacturing a TAB semiconductor device, comprising the steps of:

performing a surface treatment of a semiconductor element comprising directly contacting at least one entire surface of said semiconductor element with a silane coupling agent using a solution containing 0.5% to 5% of said silane coupling agent, wherein said semiconductor element has metal bumps thereon and metal leads electrically connected to said metal bumps;

temporarily contact-bonding a printed board having a board electrode portion at a semiconductor element mounting portion and a resin film having holes at portions where electrical connection is required by heating said resin film to a temperature not lower than a glass transition temperature of said resin film;

inserting said metal bumps on said surface-treated semiconductor element in the holes of said printed board while positioning said metal bumps in a face down orientation; and electrically connecting said semiconductor element to said board electrode of said printed board by heating and reflowing said metal bumps.

4. A method of manufacturing a TAB semiconductor device, comprising the steps of:

performing a surface treatment of a surface of a semiconductor chip using a 0.5%- to 5%-solution of a silane coupling agent, said semiconductor chip comprising a semiconductor element having metal bumps thereon and metal leads electrically connected to said metal bumps, wherein said surface treatment comprises directly contacting at least one entire surface of said semiconductor element with said solution of said said silane coupling agent;

temporarily contact-bonding a printed board having a board electrode portion at a semiconductor chip mounting portion and a resin film having holes at portions where electrical connection is required by heating said resin film to a temperature not lower than a glass transition temperature of said resin film;

inserting said metal bumps on said surface-treated semiconductor element in the holes of said printed board while positioning said metal bumps in a face down orientation;

electrically connecting said semiconductor element to said board electrode of said printed board by heating and reflowing said metal bumps;

stacking a resin film having an area larger than said element on a rear surface of said semiconductor element electrically connected to said printed board;

temporarily contact-bonding said stacked resin film to said semiconductor chip by heating said resin film in an atmosphere at a temperature not lower than the glass transition temperature of said resin film; and thermally setting said stacked resin film by further heating said resin film.

5. A method according to claim 4, wherein the step of temporarily contact-bonding said stacked resin film to said semiconductor element is performed in a reduced atmosphere.

6. A method according to claim 4, wherein the step of thermally setting said stacked resin film is performed in a nitrogen atmosphere.

7. A method of manufacturing a TAB semiconductor device, comprising the steps of:

performing a surface treatment of a surface of a semiconductor chip using a 0.5%- to 5%-solution of a silane coupling agent, said semiconductor chip comprising a semiconductor element having metal bumps thereon and metal leads electrically connected to said metal bumps, wherein said surface treatment comprises directly contacting at least one entire surface of said semiconductor element with said solution of said silane coupling agent;

temporarily contact-bonding a printed board having a board electrode portion at a semiconductor chip mounting portion and a resin film having holes at portions where electrical connection is required by heating said resin film to a temperature higher than a glass transition temperature of said resin film;

inserting said metal bumps on said surface-treated semiconductor element in the holes of said printed board while positioning said metal bumps in a face down orientation;

electrically connecting said board electrode to said printed board by heating and reflowing said metal bumps;

adhering a resin film to a side surface of said semiconductor element electrically connected to said printed board;

temporarily contact-bonding said stacked resin film to said semiconductor chip by heating said resin film in an atmosphere at a temperature not lower than a glass transition temperature of said resin film; and thermally setting said stacked resin film by further heating said resin film.

8. A method according to claim 7, wherein the step of temporarily contact-bonding said stacked resin film to said semiconductor element is performed in a reduced atmosphere.

9. A method according to claim 7, wherein the step of thermally setting said stacked resin film is performed in a nitrogen atmosphere.

10. A method according to claim 1, wherein said semiconductor element has a front surface having a front surface area treated by said coupling agent in said surface treatment and a rear surface having a rear surface area treated by said coupling agent in said surface treatment, and said resin film has a resin film surface area larger than said front surface area or said rear surface area to which said resin film is adhered.

11. A method according to claim 10, wherein said surface treatment comprises the steps of immersing said semiconductor chip in said solution of said silane coupling agent, volatizing said solution, and heating said silane-coated semiconductor element.

12. A method according to claim 1, wherein said resin film has a thickness of about 30 to 150 $\mu$m, and said metal bumps have a height of about 10 to 200 $\mu$m and a diameter of about 10 to 500 $\mu$m.

13. A method according to claim 1, wherein said resin film comprises a B-stage sheet of a thermosetting resin.

14. A method according to claim 1, wherein said resin film contains at least one material selected from the group consisting of particles, fibers, and nonwoven fabric.

15. A method according to claim 1, wherein said resin film comprises a B-stage thermosetting resin selected from the group consisting of an epoxy resin, a BT resin, a dially phthalate resin, and a derivative thereof.

16. A method according to claim 3, wherein said silane coupling agent is selected from the group consisting of γ-glycidoxypropyltrimethoxysilane and γ-aminopropyltrimethoxy-silane.

17. A method according to claim 4, wherein said resin film has a thickness of about 30 to 150 $\mu$m, and said metal bumps have a height of about 10 to 200 $\mu$m and a diameter of about 10 to 500 $\mu$m.

18. A method according to claim 4, wherein said silane coupling agent is selected from the group consisting of γ-glycidoxypropyltrimethoxysilane and γ-aminopropyltrimethoxy-silane.

19. A method according to claim 7, wherein said resin film has a thickness of about 30 to 150 $\mu$m, and said metal bumps have a height of about 10 to 200 $\mu$m and a diameter of about 10 to 500 $\mu$m.

20. A method according to claim 7, wherein said silane coupling agent is selected from the group consisting of γ-glycidoxypropyltrimethoxysilane and γ-aminopropyl-trimethoxy-silane.

\* \* \* \* \*